(12) United States Patent
Ben-Ayun et al.

(10) Patent No.: US 7,353,005 B2
(45) Date of Patent: Apr. 1, 2008

(54) WIRELESS COMMUNICATION UNIT AND LINEARISED TRANSMITTER CIRCUIT THEREFOR

(75) Inventors: Moshe Ben-Ayun, Shoham (IL); Gabriela Nocham, Tel-Aviv (IL); Mark Rozental, Gedera (IL)

(73) Assignee: Motorola, Inc., Schaumburg, IL (US)

( * ) Notice: Subject to any disclaimer, the term of this patent is extended or adjusted under 35 U.S.C. 154(b) by 79 days.

(21) Appl. No.: 10/551,599

(22) PCT Filed: Mar. 11, 2004

(86) PCT No.: PCT/EP2004/050295

§ 371 (c)(1),
(2), (4) Date: Sep. 30, 2005

(87) PCT Pub. No.: WO2004/088945

PCT Pub. Date: Oct. 14, 2004

(65) Prior Publication Data

US 2006/0234654 A1    Oct. 19, 2006

(30) Foreign Application Priority Data

Mar. 31, 2003    (GB)    ................................. 0307372.3

(51) Int. Cl.
*H04B 17/00*    (2006.01)
(52) U.S. Cl. ...................... 455/115.2; 455/126; 455/425
(58) Field of Classification Search .................. 455/91, 455/126, 115.1, 115.2, 127.1, 127.2, 423, 455/425; 375/285, 296
See application file for complete search history.

(56) References Cited

U.S. PATENT DOCUMENTS

| | | | |
|---|---|---|---|
| 5,134,718 A | | 7/1992 | Gailus |
| 5,381,108 A | * | 1/1995 | Whitmarsh et al. ............. 330/2 |
| 5,507,014 A | | 4/1996 | Valentine |
| 5,990,734 A | * | 11/1999 | Wright et al. ................... 330/2 |
| 6,381,286 B1 | * | 4/2002 | Wilkinson et al. ........... 375/296 |
| 6,639,950 B1 | * | 10/2003 | Lagerblom et al. ......... 375/297 |
| 6,687,312 B1 | * | 2/2004 | Davies ........................ 375/302 |
| 7,177,366 B1 | * | 2/2007 | Dawson et al. ............. 375/295 |
| 2002/0187761 A1 | * | 12/2002 | Im et al. ..................... 455/126 |

FOREIGN PATENT DOCUMENTS

| EP | 0 598 585 A | | 5/1994 |
|---|---|---|---|
| GB | 2348062 A | * | 9/2000 |

* cited by examiner

*Primary Examiner*—Quochien B. Vuong
(74) *Attorney, Agent, or Firm*—Indira Saladi

(57) ABSTRACT

A wireless communication unit (300) comprises a linearised transmitter (325) having a forward path, a power amplifier (324) and a feedback loop, operably coupled to the power amplifier (324) and the forward path. The feedback loop comprises a loop adjustment function (442), and the forward path and feedback loop comprise quadrature circuits. A processor (322) applies a first training signal to a first quadrature circuit loop for routing through the forward path, power amplifier and feedback path to determine at least one first parameter setting of the loop adjustment function (442). The processor (322) also applies a second training signal to a second quadrature circuit loop to determine at least a second parameter setting of the loop adjustment function (442).

12 Claims, 4 Drawing Sheets

WIRELESS COMMUNICATION UNIT AND LINEARISED TRANSMITTER CIRCUIT THEREFOR

CROSS REFERENCE TO RELATED APPLICATIONS

This application claims the benefit of prior filed co-pending international application Serial No. PCT/EP2004/050295 filed on Mar. 11, 2004, and Great Britain application Serial No. 0307372.3 filed on Mar. 31, 2004. Both of these applications are assigned to Motorola, Inc.

FIELD OF THE INVENTION

This invention relates to a radio transmitter in a wireless communication unit. The invention is applicable to, but not limited to, a training mechanism to configure a radio transmitter that employs a linearisation technique to provide a stable, linear output.

BACKGROUND OF THE INVENTION

Wireless communication systems, for example cellular telephony or private mobile radio communication systems, typically provide for radio telecommunication links to be arranged between a plurality of base transceiver stations (BTSs) and a plurality of subscriber units, often termed mobile stations (MSs). The term mobile station generally includes both hand-portable and vehicular mounted radio units. Radio frequency (RF) transmitters are located in both BTSs and MSs in order to facilitate wireless communication between the communication units.

In the field of this invention, it is known that continuing pressure on the limited radio spectrum available for radio communication systems is focusing attention on the development of spectrally efficient linear modulation schemes. By using spectrally efficient linear modulation schemes, more communication units are able to share the allocated spectrum within a defined geographical coverage area (communication cell). An example of a digital mobile radio system that uses a linear modulation method, such as n/4 digital quaternary phase shift keying (DQPSK), is the TErrestrial Trunked RAdio (TETRA) system, developed by the European Telecommunications Standards Institute (ETSI).

Since the envelopes of these linear modulation schemes fluctuate, intermodulation products can be generated in the non-linear radio frequency power amplifier(s). Specifically in the digital mobile radio (PMR) environment, restrictions on out-of-band emissions are severe (to the order of −60 dBc to −70 dBc relative to the power in adjacent frequency channels). Hence, linear modulation schemes used in this scenario require highly linear transmitters.

The actual level of linearity needed co meet particular out-of-band emission limits, is a function of many parameters, of which the most critical parameters are modulation type and bit rate. Quantum processes within a typical radio frequency (RF) amplifying device are non-linear by nature. Only a straight line may approximate the transfer function of the amplifying device when a small portion of the consumed direct current (DC) power is transformed into radio frequency (RF) power, i.e. as in an idea linear amplifier case. This mode of operation provides a low efficiency of DC to RF power conversion, which is unacceptable for portable units.

The emphasis in portable PMR equipment is to increase battery life. Hence, it is imperative to maximise the operating efficiencies of the amplifiers used. To achieve both linearity and efficiency, so called linearisation techniques are used to improve the linearity performance of the more efficient classes of amplifier, for example class AB, B or C amplifiers. One such linearisation technique, often used in designing linear transmitters, is Cartesian Feedback. This is a 'closed loop' negative feedback technique, which sums the baseband feedback signal in its digital 'I' and 'Q' formats with the corresponding generated 'I' and 'Q' input signals in the forward path. This 'closed loop' I-Q combination is performed prior to amplifying and up converting the input signal to its required output frequency and power level. The linearising of the power amplifier output requires the accurate setting of the phase and amplitude of a feedback signal.

Details of the operation of such a lineariser is described in the paper "Transmitter Linearisation using Cartesian Feedback for Linear TDMA Modulation" by M Johansson and T Mattsson 1991 IEEE.

The lineariser circuit optimises the performance of the transmitter, for example to comply with linearity or output power specifications of the communication system, or to optimise the operating efficiency of the transmitter power amplifier. Operational parameters of the transmitter are adjusted to optimise the transmitter performance and include as an example, one or more of the following: amplifier bias voltage level, input power level, phase shift of the signal around the feedback loop. Such adjustments are performed by say, a microprocessor. Due to the sensitivity of such transmitter circuits, a range of control and adjustment circuits and/or components are needed so that a linear and stable output signal can be achieved under all operating circumstances.

All linearisation techniques require a finite amount of time in which to linearise the performance of a given amplifying device. The 'linearisation' of the amplifying device is often achieved by initially applying a training sequence to the lineariser circuit and the amplifying device in order to determine the levels of phase and gain distortion introduced by the linearisation loop and the amplifying device. Once the phase and gain distortion levels have been determined, they can be compensated for, generally by adjusting feedback components/parameters.

To accommodate for such linearisation requirements, communication systems typically allocate specific training periods for individual users to train their transmitters. The TErrestrial Trunked RAdio (TETRA) standard includes a time frame, termed a Common Linearisation Channel (CLCH) as is described in UK Patent Application No. 9222922.8, to provide a full-training period approximately once every second. The CLCH frame allows a radio to 'train' prior to gaining access to the system. However, a radio having to wait up to one second before training and then accessing the system is undesirable. To assist this significant delay in call set-up times, and also provide an additional period for fine tuning a radio's output characteristics, due to changes in temperature, supply voltage or frequency of operation, a reduced training sequence has been inserted at the beginning of each TETRA traffic time slot for the radio allocated that slot to perform a minimal amount of training or fine tuning. This period may be used for phase training.

An example of such a training sequence is described in U.S. Pat. No. 5,066,923 of Motorola Inc., which describes a training scheme where the phase of the amplifier is adjusted in an 'open-loop' mode and the gain of the amplifier is adjusted when the loop is closed.

During phase training, the Cartesian feedback loop is configured to be 'open loop', i.e. a switch is used to prevent the fed-back signal from being combined with the signal routed through the transmitter circuit. In this regard, in a phase training mode of operation, a positive signal is applied to the I-channel input. The phase shift around the loop is measured and, in response to the measured I-channel phase shift, the phase around the loop on both the 'I'-channel and the 'Q'-channel is adjusted by a phase shifter.

FIG. 1 illustrates a phase diagram 100 with a perfect I/Q quadrature balance, i.e. a 90-degree phase difference between the I-channel 120 and the Q-channel 110. The Cartesian loop is opened and a positive baseband signal applied to the input of the 'I'-channel. Phase training control circuitry monitors the signal before switch 426 on the Q channel—indicated as Vfq 455. A successive approximation register (SAR) phase training algorithm controls the phase shifter and minimises the Vfq voltage. At the end of the SAR algorithm, phase training corrects the loop phase by an angle β. A voltage value prior to the switch on the Q channel is then reduced close to zero. The sane process is repeated for a negative baseband signal input to the I-channel. The calculated results from both the positive and negative training applied to the I-channel are averaged and used to adjust the phase around both the I-channel loop and the Q-channel loop.

The inventors of the present invention have recognised and appreciated that, in practice, the perfect I-Q 90-degree relationship is rarely achieved. This imbalance results from the various component tolerances within the respective 'I' and 'Q' loops. An unbalanced phase relationship 200 is illustrated in FIG. 2. Here, Q' is the actual loop's quadrature axis 210. The Q' axis 210 deviates from the ideal Q axis 110 by α degrees 220. Again Vfq is minimnized using Q' axis 210 as quadrature. From FIG. 2, we can see that instead of correcting the loop phase by β degrees 230, the phase training process has corrected the loop phase by β−α degrees 240. This means that phase training provides a result that is inaccurate by α degrees 220. With reference to FIG. 4, the I/Q imbalance α may be in the forward 436 or feedback 422 I/Q generator. For example, the feedback I/Q generator 422 may shift the LO phase by 90-α degrees, instead of an ideal 90 degrees.

The inventors of the present invention have identified that any quadrature imbalance in the generation of linearised signals during the training sequence of a Cartesian loop transmitter may cause significant phase training errors. Accurate phase training is a critical stage in the linearisation of such transmitter circuits, as the phase accuracy has a substantial effect on loop stability and wideband noise.

Thus, there currently exists a need to provide an improved transmitter circuit, and in particular a mechanism for improving phase training accuracy, wherein the abovementioned disadvantages may be alleviated.

STATEMENT OF INVENTION

In accordance with a first aspect of the present invention, there is provided a wireless communication unit. The wireless communication unit comprises a linearised transmitter having a forward path, a power amplifier and a feedback loop, operably coupled to the power amplifier and the forward path. The feedback loop comprises a loop adjustment function. The forward path and feedback loop comprise quadrature circuits. A processor applies a first training signal to a first quadrature circuit loop for routing through the forward path, power amplifier and feedback path to determine at least one first parameter setting of the loop adjustment function. The processor additionally applies a second training signal to a second quadrature circuit loop to determine at least a second parameter setting of the loop adjustment function.

Preferably, the first training signal and the second training signal have substantially the same signal parameters, for example where they are phase training signals. In this regard, the loop adjustment function is a phase shifter for adjusting a phase shift in the first and second quadratute circuit loops. A phase calculation function, operably coupled to the phase shifter, calculates a phase shift in each of the first and second quadrature circuit loops, thereby determining an imbalance therebetween.

In this manner, by applying a training signal to both quadrature loops, any I/Q imbalance in the respective loops will not influence the loop phase that will be calculated using the inventive concepts described herein.

In accordance with a second aspect of the present invention, a radio frequency transmitter integrated circuit is provided, as claimed in claim 9.

In accordance with a third aspect of the present invention, a method of training a linearised transmitter is provided, as claimed in claim 10.

In accordance with a fourth aspect of the present invention, a storage medium is provided, as claimed in claim 12.

Further aspects of the invention are provided in the dependent claims.

Figure 1:
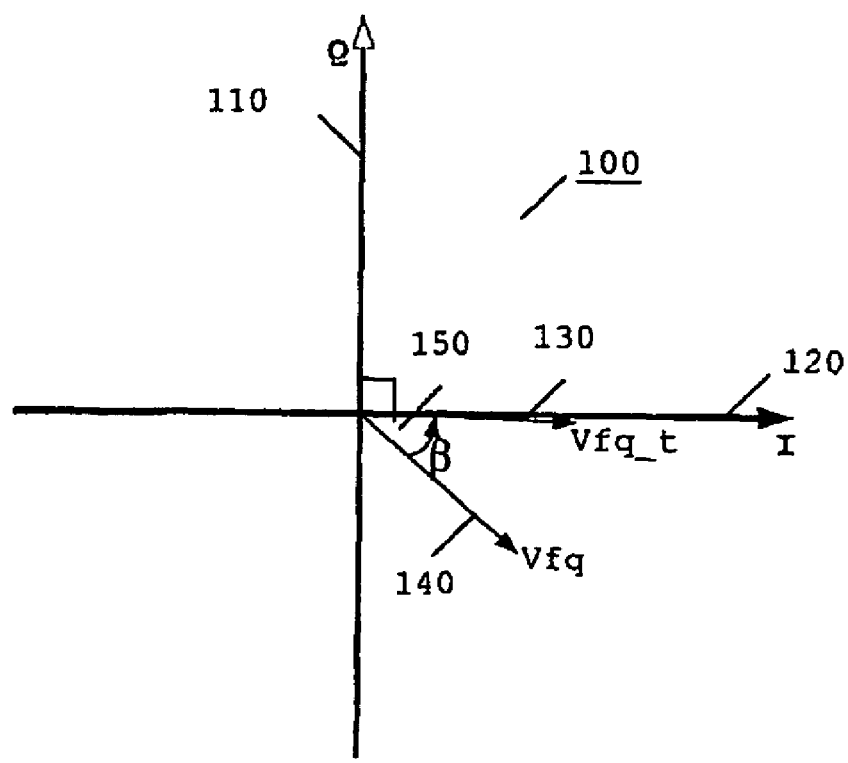
FIG. 1 shows a phase diagram of an ideal I-Q relationship in a feedback loop of a linear transmitter arrangement.
Figure 2:
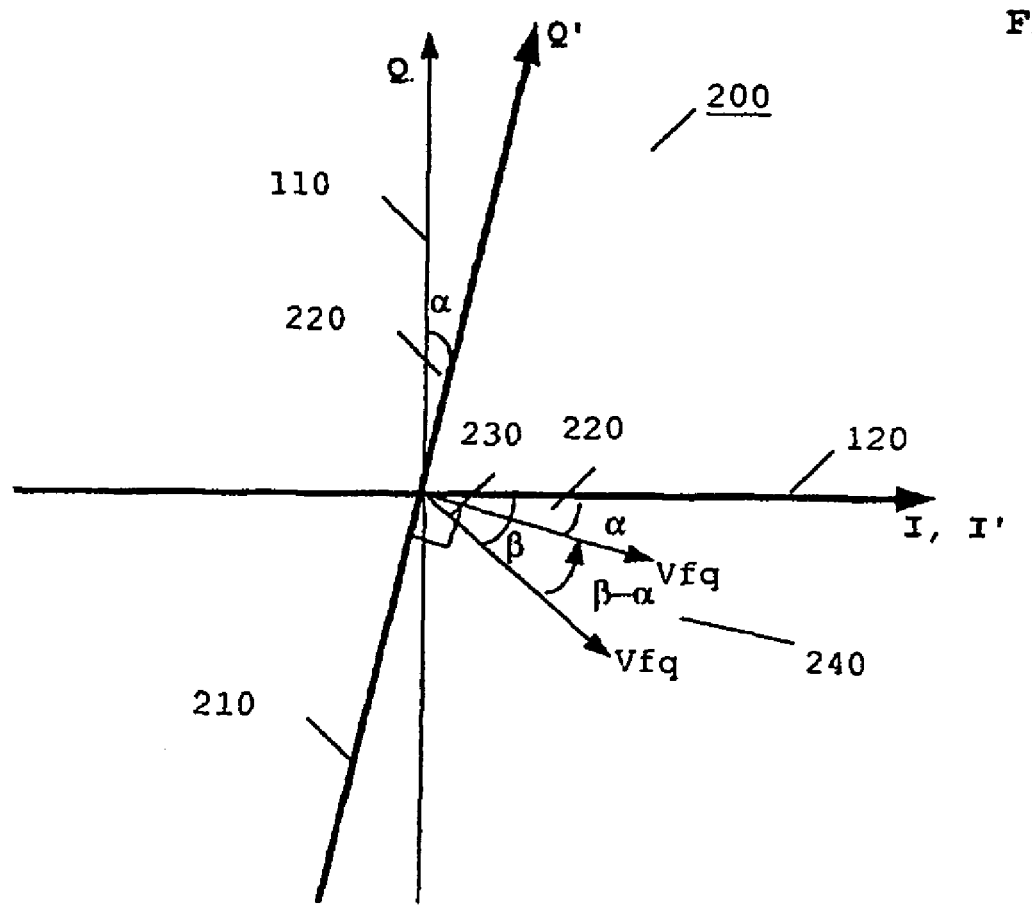
FIG. 2 shows a phase diagram of an unbalanced I-Q relationship in a feedback loop of a linear transmitter arrangement.
Figure 3:
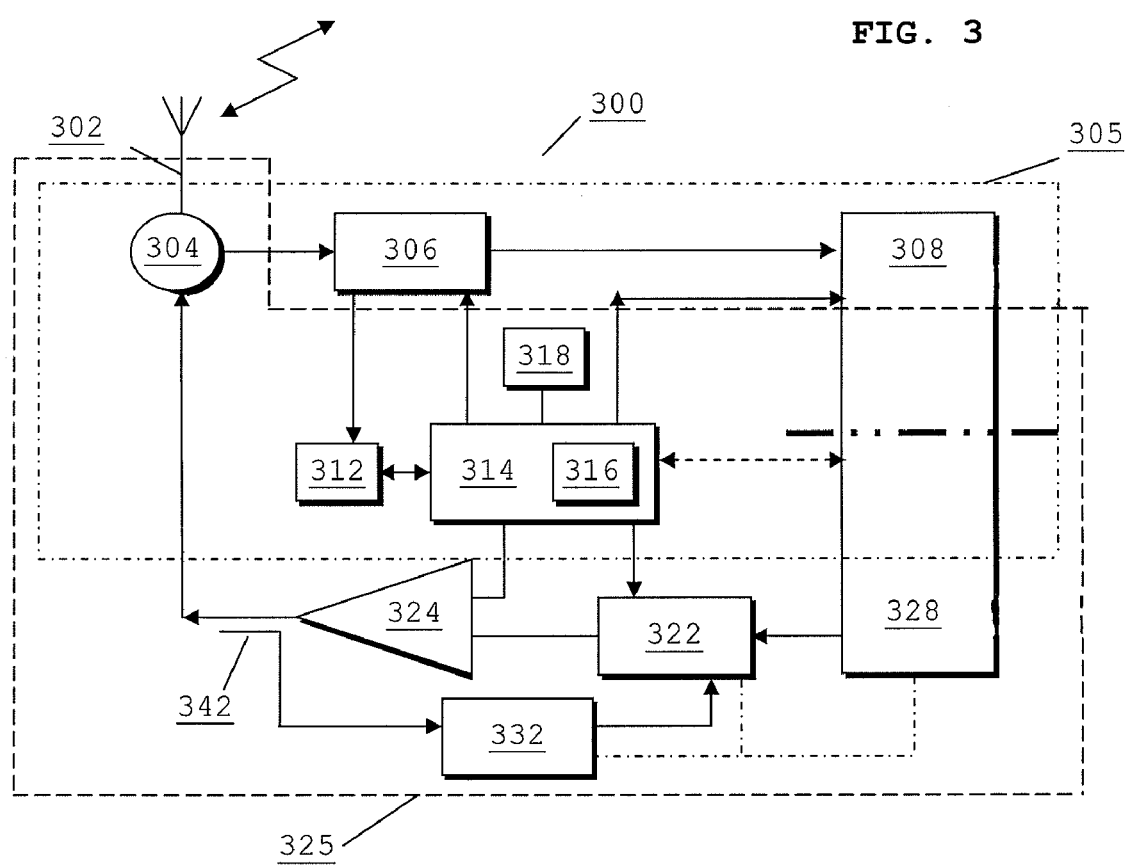
Figure 4:
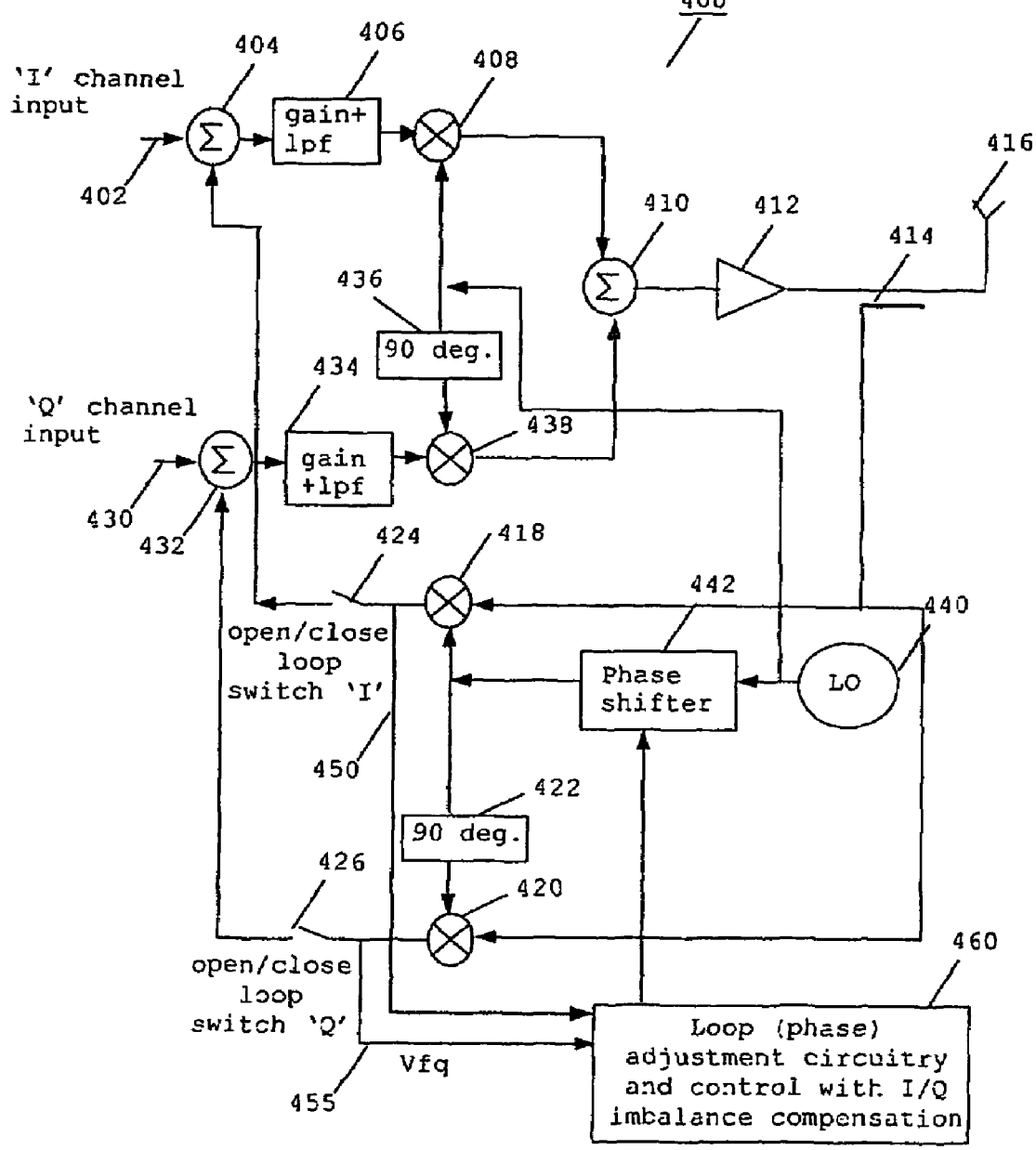
Figure 5:
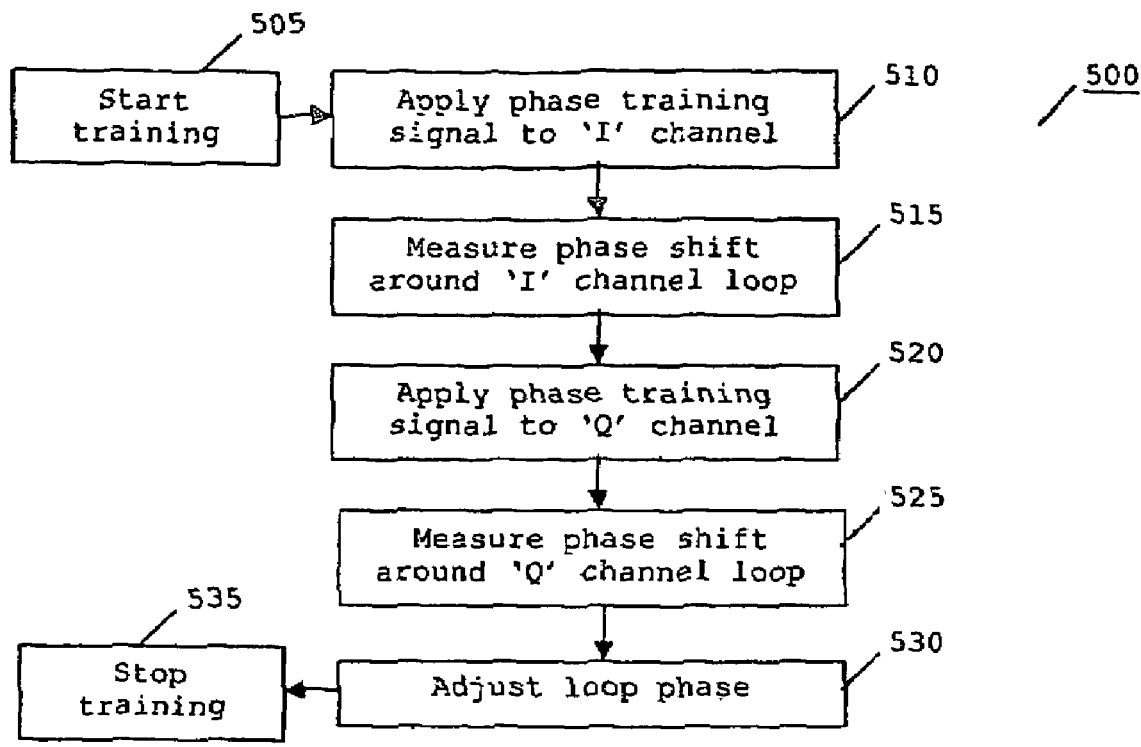
Figure 6:
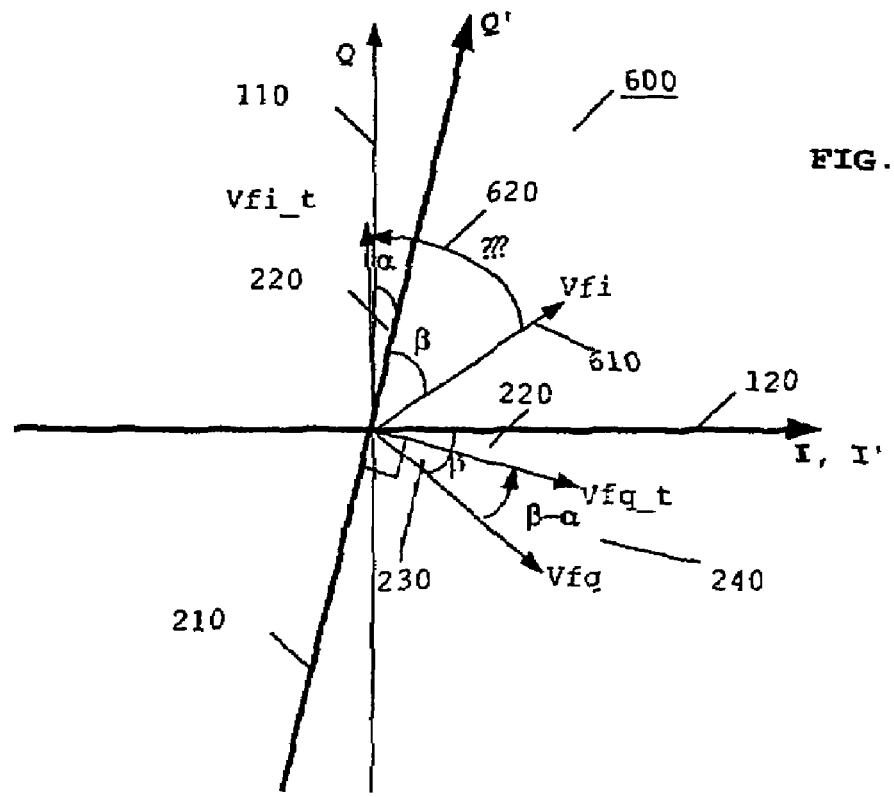

Exemplary embodiments of the present invention will now be described, with reference to the accompanying drawings, in which:

FIG. 3 illustrates a block diagram of a wireless communication unit adapted to support the various inventive concepts of a preferred embodiment of the present invention;

FIG. 4 illustrates a block diagram of a linearised transmitter topology adapted in accordance with the preferred embodiment of the present invention;

FIG. 5 illustrates a flowchart of a linearisation training process in accordance with the preferred embodiment of the present invention; and FIG. 6 illustrates a phase diagram of an unbalanced I-Q relationship modified in a feedback loop of a linear transmitter arrangement according to the preferred embodiment of the present invention.

DESCRIPTION OF PREFERRED EMBODIMENTS

Referring now to FIG. 3, a block diagram of a wireless communication unit 300 adapted to support the inventive concepts of the preferred embodiments of the present invention, is illustrated. For the sake of clarity, the wireless communication unit 300 is shown as divided into two distinct portions—a receiver chain 305 and a transmitter chain 325.

The wireless communication unit 300 contains an antenna 302. The antenna 302 is preferably coupled to an antenna switch 304 that provides signal control of radio frequency (RF) signals in the wireless communication unit 300, as well as isolation, between the receiver chain 305 and transmitter chain 325. Clearly, the antenna switch 304 could be replaced with a duplex filter, for frequency duplex communication units as known to those skilled in the art.

For completeness, the receiver 305 of the wireless communication unit 300 will be briefly described. The receiver 305 includes a receiver front-end circuitry 306 (effectively providing reception, filtering and intermediate or base-band frequency conversion). The front-end circuit 306 is serially coupled to a signal processing function (generally realised by at least one digital signal processor (DSP)) 308. A controller 314 is operably coupled to the front-end circuitry 306 so that the receiver can calculate receive bit-error-rate (BER) or frame-error-rate (FER) or similar link-quality measurement data from recovered information via a received signal strength indication (RSSI) 312 function. The RSSI 312 function is operably coupled to the front-end circuit 306. A memory device 316 stores a wide array of data, such as decoding/encoding functions and the like, as well as amplitude and phase settings to ensure a linear and stable output. A timer 318 is operably coupled to the controller 314 to control the timing of operations, namely the transmission or reception of time-dependent signals.

As regards the transmit chain 325, this essentially includes a processor 328, lineariser circuitry (including transmitter/modulation circuitry) 322 and an up-converter/power amplifier 324. The processor 328, lineariser circuitry 322 and the up-converter/power amplifier 324 are operationally responsive to the controller 314, with an output from the power amplifier 324 coupled to the antenna switch 304. A feedback circuit includes a down-converter 332, which forms together with the lineariser circuitry 322 power amplifier 324 and directional coupler 342 a real-time Cartesian feedback loop to ensure a linear, stable transmitter output.

Prior to transmitting real data, the linearised transmitter of the preferred employs a training algorithm, to determine appropriate gain and phase adjustment parameters to ensure a stable, linear output. Notably, the preferred embodiment of the present invention proposes a mechanism that improves an accuracy of the phase training, for example utilising the phase training algorithm described in U.S. Pat. No. 5,066,923 of Motorola Inc., which is incorporated herein by reference. The proposed mechanism enables I/Q imbalances within the loop to be compensated for.

Although the preferred embodiment of the present invention is described with reference to phase training, it is envisaged that the inventive concepts are equally applicable to any other training signals that can be routed around the respective quadrature loops to identify imbalances therebetween, for example using amplitude training signals.

FIG. 4 shows a more detailed Cartesian loop configuration 400, adapted to support the preferred embodiment of the present invention. The configuration is described in the context of a phase training process, but clearly the same configuration is used when transmitting real data.

A phase training signal, for example a sine wave, is input to the I channel 402. The phase training signal is not combined with any other signal in summing junction 404, as the circuit has been arranged for open-loop operation by controlling switches 424 and 426. The input signal is then input to a gain and low-pass filter block 406 where it is amplified and filtered. The amplified input signal is then up-converted by mixing it with a signal from local oscillator 440 in mixer 408. The up-converted signal is then routed to the RF amplifier chain 412, where a portion of the amplified RF signal is fed back via directional coupler 414.

The fed back signal is routed to down-conversion mixer 418, where it is mixed with a phase-shifted 442 version of a signal from the local oscillator 440. The amount of phase shift is controlled by a phase calculation and adjustment function 460.

Notably, in accordance with the preferred embodiment of the present invention, a second phase training sequence is now applied to the 'Q' channel input 430. The phase training signal, preferably the same sine wave, is input to the Q-channel. The phase training signal is not combined with any other signal in summing junction 432, as the circuit has been arranged for open-loop operation by controlling switches 424 and 426. The 'Q' input signal is then input to a gain and low-pass filter block 434 where it is amplified and filtered. The amplified input signal is then up-converted by mixing it with a ninety-degree 436 phase-shifted representation of a signal from the local oscillator 440 in mixer 438. The up-converted signal is then routed to the RF amplifier chain 412, where a portion of the amplified RF signal is fed back via directional coupler 414.

The fed back signal is routed to down-conversion mixer 420, where it is mixed with a phase-shifted 442 version of the local oscillator signal. The phase-shifted version of the local oscillator signal has been further phase shifted by ninety-degrees 422 to account for the ideal I-Q quadrature nature of the circuit. The amount of phase shift is again controlled by the phase calculation and loop adjustment function 460.

In this manner, the phase shift of both the I-channel loop and the Q-channel loop are measured. Once the respective phase-shifts have been calculated, they are compensated for by appropriate adjustment of the phase-shifter, under control of the phase calculation and loop adjustment function 460.

It is envisaged that the aforementioned training mechanism is preferably implemented using a signal processor function. More generally, the inventive concepts may be implemented in a wireless communication unit in any suitable manner for example by re-programming or adapting a processor in the wireless communication unit. For example, a new processor may be added to a conventional wireless communication unit, or alternatively existing parts of a conventional wireless communication unit may be adapted, for example by reprogramming one or more processors therein. As such the required adaptation may be implemented in the form of processor-implementable instructions stored on a storage medium, such as a floppy disk, hard disk, programmable read-only memory (PROM), random access memory (RAM) or any combination of these or other storage media.

In summary, the preferred phase training process is illustrated in the flowchart 500 of FIG. 5. The linearisation training process commences in step 505. A training signal, for example a phase training signal, is input to a first quadrature loop, for example the 'I' channel loop, in step 510. The phase shift exerted upon the phase training signal around the 'I' channel loop is then measured in step 515. A training signal, for example the same phase training signal, is then input to a second quadrature loop, for example the 'Q' channel loop, in step 520. The phase shift exerted upon the phase training signal around the 'Q' channel loop is then measured in step 520. The respective phase shifts are then calculated, in step 525. The phase shifts are then compensated for by appropriate loop phase adjustments as shown in step 530, to ensure the loop phase shift is accurately controlled. The training process is then complete as shown in step 535.

It is within the contemplation of the invention that the phase shifter is adjusted after performing both the I-channel phase training and the Q-channel phase training. However, it is envisaged that in some circumstances the phase-shifter may be adjusted after each individual phase calculation has been made.

Thus, a primary distinguishing feature of the present invention is the application of two training signals: a first training sequence on the I-channel followed by a second training sequence on the Q-channel. It is envisaged that, for other linear transmitter topologies or linearisation techniques, a training sequence, for example phase training, on the 'I' channel and the 'Q' channel may be performed simultaneously, rather than successively. It is also envisaged that the use of two training sequences: one for the I-channel and one for the Q-channel, may comprise any combination or order of phase training and/or amplitude training processes.

Referring now to FIG. 6, a phase diagram 600 of an unbalanced I-Q relationship is illustrated, whereby the phase has been modified in the feedback loop of the linear transmitter arrangement according to the preferred embodiment of the present invention. From FIG. 6 it can be seen that when phase training is being performed on the 'I' channel, the phase loop correction is $\beta-\alpha$ 240.

The second 'Q' channel loop phase is set to the phase setting used before performing the I-channel phase training. Now, when phase training is being performed on the Q' channel, the correction is $\beta+\alpha$ 620.

From the above calculations it is possible to calculate the correct loop phase rotation needed $\beta$ 230 even though there is a quadrature imbalance in the loop.

In summary, a new phase training method for elimination of errors in a Cartesian feedback loop linear transmitter has been described. The aforementioned inventive concepts provide a mechanism for compensating quadrature generator imbalances within the transmitter. Advantageously, I-Q imbalance of both forward and feedback quadrature generator circuits are compensated for, both of which influence the phase adjustment calculation. Furthermore, as imbalances in the forward and backward quadrature generator circuits are compensated for, it is possible to use less expensive components with a reduced tolerance and performance.

It is envisaged that integrated circuit manufacturers may utilise the inventive concepts hereinbefore described. For example, it is envisaged that a radio frequency linearised transmitter integrated circuit (IC) containing the aforementioned transmitter circuit arrangement and method of training could be manufactured to be incorporated into a wireless communication unit.

Advantageously, the inventive concepts of the present invention provide a significant benefit to the manufacturers of linearised transmitter circuits, by compensating for quadrature imbalance by improving the accuracy of a training process. For example, it is also within the contemplation of the invention that alternative linearisation techniques can benefit from the inventive concepts described herein. As an alternative to using Cartesian feedback, a pre-distortion form of lineariser may be adapted to implement the preferred or alternative embodiments of the present invention. Y. Nagata described an example of a suitable pre-distortion transmitter configuration in the 1989 IEEE paper titled "Linear Amplification Technique for Digital Mobile Communications".

However, it is within the contemplation of the invention that the transmitter configuration of the preferred embodiment of the present invention may be applied to any wireless transmitter circuit.

Furthermore, it is within the contemplation of the invention that the wireless communication unit employing the linearised transmitter may be any wireless communication device, such as a portable or mobile PMR radio, a mobile phone, a personal digital assistant, a wireless laptop computer, etc. It is also envisaged that the inventive concepts described herein are not limited to use in subscriber equipment, but may also be utilised in other communication units such as base station equipment.

It will be understood that the wireless communication unit and linearised transmitter circuits, as described above, tend to provide at least one or more of the following advantages:
  (i) Improved phase training resulting in a more stable output of the linearised transmitter circuit.
  (ii) The improved phase training result is not corrupted by the I/Q generators phase imbalance. Hence, reduced tolerance components can be used in the loop I/Q generators.
  (iii). Improved phase training results in a better wideband noise performance due to more accurate phase training.

Whilst specific, and preferred, implementations of the present invention are described above, it is clear that one skilled in the art could readily apply further variations and modifications of such inventive concepts.

Thus, a wireless communication unit with a linearised transmitter topology and improved training mechanism have been described that substantially addresses the problems associated with known linearised transmitters.

The invention claimed is:

1. A wireless communication unit comprising a linearised transmitter having:
  a forward path for routing a signal to be transmitted;
  a power amplifier for transmitting a linearised radio signal;
  a feedback loop, operably coupled to the power amplifier and the forward path, comprising a loop adjustment function, wherein the forward path and feedback loop comprise quadrature circuits; and
  a processor for applying a first training signal to a first quadrature circuit loop for routing through the forward path, power amplifier and feedback path to determine at least one first parameter setting of the loop adjustment function, wherein
  said processor applies a second training signal to a second quadrature circuit loop to determine at least one second parameter setting of the loop adjustment function; and
  said first and second training signals are applied by the processor while the first and second quadrature circuit loops are open.

2. The wireless communication unit according to claim 1, wherein said first training signal and said second training signal have substantially the same signal parameters.

3. The wireless communication unit according to claim 2, wherein the loop adjustment function is a phase shifter for adjusting a phase shift in the first and second quadrature circuit loops.

4. The wireless communication unit according to claim 3, further comprising a phase calculation function operably coupled to said phase shifter to calculate a phase shift in each of the first and second quadrature circuit loops, thereby ascertaining an imbalance therebetween.

5. The wireless communication unit according to claim 1, wherein said processor applies said first training signal to the linearised transmitter prior to applying said second training signal.

6. The wireless communication unit according to claim 1 wherein the linearised transmitter is a Cartesian feedback linearised transmitter such that said adjustment is applied to a real-time feedback loop.

7. The wireless communication unit according to claim 1, wherein said wireless communication unit is capable of operation on a TETRA communication system.

8. The wireless communication unit according to claim 1, wherein said wireless communication unit is a subscriber unit or a base transceiver station.

9. A linearised transmitter integrated circuit comprising:
a linearised transmitter for transmitting a linearised radio signal, and
a forward path comprising quadrature circuits for routing a signal to be transmitted and for operable coupling to a power amplifier for transmitting a linearised radio signal;
a feedback loop, operably coupled to the forward path and for operable coupling to an output of a power amplifier, wherein the feedback loop comprises a loop adjustment function, and quadrature circuits; and
a processor, operably coupled to the feedback loop for applying a first training signal to a first quadrature circuit loop in the linear transmitter integrated circuit to be routed through the forward path, power amplifier and feedback path to determine at least one first parameter setting of the loop adjustment function,
wherein said processor applies a second training signal to a second quadrature circuit loop in the linear transmitter integrated circuit to determine at least one second parameter setting of the loop adjustment function; and
wherein said first and second training signals are applied by the processor while the first and second quadrature circuit loops are open.

10. A method of training a linearised transmitter having a forward path, a power amplifier and a feedback loop comprising a loop adjustment function, wherein the forward path and feedback loop comprise quadrature circuits, the method comprising the steps of:

applying a first training signal to be routed through a first quadrature circuit loop of the forward path, power amplifier and feedback path, wherein said first training signal is applied while the first quadrature circuit loop is open; and determining at least one first parameter setting for the loop adjustment function based on the first training signal, applying a second training signal to a second quadrature circuit loop of the forward path, power amplifier and feedback path, wherein said second training signal is applied while the second quadrature circuit loop is open; and determining at least one second parameter setting for the loop adjustment function based on the second training signal.

11. The method of training a linearised transmitter according to claim 10, the method further comprising adjusting said loop adjustment function based on a determination made on the first training signal and a determination made on the second training signal.

12. The method of training a linearised transmitter according to claim 10 wherein the steps are performed in a storage medium storing processor.

* * * * *